United States Patent [19]
Forbes

[11] Patent Number: 6,104,068
[45] Date of Patent: Aug. 15, 2000

[54] STRUCTURE AND METHOD FOR IMPROVED SIGNAL PROCESSING

[75] Inventor: Leonard Forbes, Corvallis, Oreg.

[73] Assignee: Micron Technology, Inc., Boise, Id.

[21] Appl. No.: 09/145,100

[22] Filed: Sep. 1, 1998

[51] Int. Cl.[7] .............................. H01L 29/78; H01L 29/80
[52] U.S. Cl. .......................... 257/365; 257/401; 257/623
[58] Field of Search .................................... 257/365, 401, 257/423; 327/105

[56] References Cited

U.S. PATENT DOCUMENTS

| | | | |
|---|---|---|---|
| 4,605,909 | 8/1986 | Tsironis | ..................................... 331/96 |
| 5,057,896 | 10/1991 | Gotou . | |
| 5,391,895 | 2/1995 | Dreifus . | |
| 5,661,424 | 8/1997 | Tang | ...................................... 327/105 |

FOREIGN PATENT DOCUMENTS 4370978  12/1992  Japan .

OTHER PUBLICATIONS

Mitano et al, High Speed... Trench MOSFET with Dual Gate, VLSI Symposium Digest, 1988.

GaAs IC Symposium, IEEE Gallium Arsenide Integrated Cisuit Symposium, 19th Annual Technical Digest, Anaheim, California, pp. 1–290, (Oct. 12–15, 1997).

Asai, S., et al., "The GaAs Dual–Gate Fet With Low Noise And Wide Dynamic Range", *Technical Digest, International Electron Devices Meeting*, pp. 64–67, (Dec. 1973).

Colinge, J.P., "Reduction of Kink Effect in Thin–Film SOI MOSFET's", *IEEE Electron Device Letters*, 9(2), pp. 97–99, (1988).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Nishinohara, K., et al., "Effects of Microscopic Fluctuations in Dopant Distributions on MOSFET Threshold Voltage", *IEEE Transactions on Electron Devices*, 39(3), pp. 634–639, (Mar. 1992).

Stolk, P.A., et al., "The Effect of Statistical Dopant Fluctuations on MOS Device Performance", *IEEE*, pp. 23.4.1–23.4.4, (1996).

Takeuchi, K., et al., "Channel Engineering for the Reduction of Random–Dopant–Placement–Induced Threshold Voltage Fluctuations", *IEEE*, pp. 33.6.1–33.6.4, (1997).

Taur, Y., et al., "CMOS Devices below 0.1 micrometer: How High Will Performance Go?", *IEEE*, pp. 9.1.1–9.1.4, (1997).

Wong, H.S., et al., "Self–Aligned (Top and Bottom) Double–Gate MOSFET with a 25 nm Thick Silicon Channel", *IEEE*, pp. 16.6.1–16.6.4, (1997).

Wong, H.S., et al., "Three–Dimensional "Atomistic" Simulation of Discrete Random Dopant Distribution Effects in Sub–0.1 micrometer MOSFET's", *IEEE*, pp., 29.2.1–29.2.4, (1993).

*Primary Examiner*—Stephan D. Meier
*Attorney, Agent, or Firm*—Schwegman, Lundberg, Woesner & Kluth, P.A.

[57] ABSTRACT

An improved structure and method are provided for signal processing. The structure includes dual-gated metal-oxide semiconducting field effect transistor (MOSFET). The dual-gated MOSFET can be fabricated according to current CMOS processing techniques. The body region of the dual-gated MOSFET is a fully depleted structure. The structure includes two gates which are positioned on opposite sides of the opposing sides of the body region. Further, the structure operates as one device where the threshold voltage of one gate depends on the bias of the other gate. Thus, the structure yields a small signal component in analog circuit applications which depends on the product of the signals applied to the gates, and not simply one which depends on the sum of the two signals.

48 Claims, 2 Drawing Sheets

STRUCTURE AND METHOD FOR IMPROVED SIGNAL PROCESSING

RELATED APPLICATIONS

This application is related to the co-filed and commonly assigned application, attorney docket number 303.517US1, entitled "Structure and Method for Reducing Threshold Voltage Variations Due To Dopant Fluctuations" by inventors Leonard Forbes and Wendell P. Noble, which is hereby incorporated by reference. Further, this application is related to co-pending application Ser. No. 08/889,462, entitled "Memory Cell Having A Vertical Transistor with Buried Source/Drain And Dual Gates," filed on Jul. 8, 1997, and co-pending application Ser. No. 09/050,281, entitled "Circuits and Methods for Dual-Gated Transistors," filed on Mar. 30, 1998, which applications are also incorporated herein by reference.

FIELD OF THE INVENTION

The present invention relates generally to semiconductor integrated circuits. More particularly, it pertains to the structure and method for improved signal processing.

BACKGROUND OF THE INVENTION

There is a requirement in analog and radio frequency (RF) integrated circuits for devices known as mixers or multipliers which can take the product of two signals, not just the sum or difference as in simple analog amplifiers or analog computers. This enables the construction of variable gain amplifiers, modulators, heterodyne receivers, frequency multipliers, frequency dividers, synthesizers, and a wide variety of other signal processing functions.

Integrated circuits, such as mixers and multipliers, require the use of a nonlinear solid state device. The simplest nonlinear device employed in a signal mixer or multiplier is the diode such as used in TV satellite receivers. The nonlinear characteristics of the diode are used to obtain an intermediate frequency from the product of a local oscillator frequency and an input signal frequency. This product yields, besides the original signals, signals at the sum and differences of the local oscillator frequency and an input signal frequency. The intermediate signal frequency at the difference of the local oscillator frequency and an input signal frequency is used for down conversion of the input signal frequency to lower frequencies where it can then be more easily amplified and demodulated to remove the useful information.

Transistors are also used to fabricate integrated circuits which have the mixer and multiplier capability. Often metal-semiconductor field effect transistors (MESFET's) are employed as the nonlinear solid state device. The MESFET is typically referred to as a dual gate FET, as used in RF GaAs integrated circuits. The device structure can be understood in simple terms by considering it to be two FETs in series where dual gates of the MESFET are adjacent to each other and in series between the source and drain. Further, the drain of the first or lower transistor is in contact, internally, with the source of the upper or top device and there is no external contact to this point. The action of this device can be understood by realizing the gate to source voltage of the second or top device depends on the biasing of the gate to source voltage of the lower or bottom device. This results in the operation depending on the product of the signals on the two gates. Such GaAs dual gate FETs are typically used in a wide variety of signal processing functions at high frequencies, e.g., in the gigahertz (GHz) range including, most recently, cellular or wireless telephones.

Wireless or cellular telephones provide a good example of the shortcomings with using MESFETs in digital technology applications. That is, such digital devices require the integration of both RF and digital integrated circuit functions. Integrating analog and digital circuitry requires significant circuitry real estate and involves non-analogous fabrication steps. The push in integrated circuit technology is to develop more and more compact devices through simplified processing routines. It would be ideal to incorporate both analog and digital functions on a single chip while at the same time maintaining streamlined fabrication processes. Thus, there is a need for RF and digital integrated circuits which can be implemented on a single integrated circuit chip, e.g., a single complementary metal oxide semiconductor (CMOS) integrated circuit chip, using analogous fabrication techniques.

SUMMARY OF THE INVENTION

The above-mentioned problems with integrated circuits and other problems are addressed by the present invention and will be understood by reading and studying the following specification. A structure and method which offer improved functionality are provided.

In particular, an illustrative embodiment of the present invention includes a mixer circuit. The mixer circuit has a transistor extending outwardly from a semiconductor substrate. The transistor has a first source/drain region, a body region, and a second source/drain region. The body region has opposing sidewall surfaces. And, the body region is formed of a fully depleted structure. A first gate is located on a first one of the opposing sidewall surfaces. A second gate is located on a second one of the opposing sidewall surfaces. Further, a local oscillator is coupled to the first gate, and a signal input is coupled to the second gate.

In another embodiment of the present invention, an analog circuit is provided. The analog circuit includes a dual-gated metal-oxide semiconducting field effect transistor (MOSFET) which extends outwardly from a semiconductor substrate. The dual-gated MOSFET has a first and a second source/drain region. The dual-gated MOSFET has a body region which includes opposing sidewall surfaces. The body region is formed of a fully depleted structure. A first gate is located on a first one of the opposing sidewall surfaces. A second gate located on a second one of the opposing sidewall surfaces. Further, a local oscillator can be coupled to the first gate to receive signals from a local oscillator signal and an analog signal input can be coupled to the second gate and provides an input signal to he second gate.

In another embodiment of the present invention, a signal processing integrated circuit is provided which includes both analog and digital circuits. The analog circuit includes a dual-gated metal-oxide semiconducting field effect transistor (MOSFET) which extends outwardly from a semiconductor substrate. The dual-gated MOSFET has a first and a second source/drain region. The dual-gated MOSFET has a body region which includes opposing sidewall surfaces. The body region is formed of a fully depleted structure. A first gate is located on a first one of the opposing sidewall surfaces. A second gate is located on a second one of the opposing sidewall surfaces. Further, a local oscillator can be coupled to the first gate to receive signals from a local oscillator signal and an analog signal input can be coupled to the second gate and provides an input signal to the second gate.

In another embodiment of the present invention, a communication device is provided. The communication device includes a signal processing circuit. The signal processing circuit has a dual-gated metal-oxide semiconducting field effect transistor (MOSFET) which extends outwardly from a semiconductor substrate. The dual-gated MOSFET includes a first and a second source/drain region. The dual-gated MOSFET has a body region which has opposing sidewall surfaces. The body region is formed of a fully depleted structure. A first gate is located on a first one of the opposing sidewall surfaces. A second gate is located on a second one of the opposing sidewall surfaces. Further, a local oscillator is coupled to the first gate and provides a local oscillator signal to the first gate. A signal input is coupled to the second gate and provides an input signal to the second gate. The communication device also includes a receiver and a transmitter which are electrically coupled to the signal processing circuit for receiving and transmitting signals.

Yet another embodiment of the present invention includes a method of signal processing. The method includes biasing a first gate of a dual-gated MOSFET. The dual-gated MOSFET has a first and a second source/drain region. The dual-gated MOSFET has a body region which has opposing sidewall surfaces. The body region is formed from a fully depleted structure. The first gate opposes a first one of the opposing sidewall surfaces. A second gate of the dual-gated MOSFET is similarly biased. The second gate opposes a second one of the opposing sidewall surfaces. The method further includes a local oscillator signal to the first gate and applying an input signal to the second gate.

Thus, an improved structure and method are provided for signal processing. The structure includes a dual-gated metal-oxide semiconducting field effect transistor (MOSFET). The dual-gated MOSFET can be fabricated according to current CMOS processing techniques. The body region of the dual-gated MOSFET is a fully depleted structure. The structure includes two gates which are positioned on opposite sides of the opposing sides of the body region. Further, the structure operates as one device where the threshold voltage of one gate depends on the bias of the other gate. Thus, the structure yields a small signal component in analog circuit applications which depends on the product of the signals applied to the gates, and not simply one which depends on the sum of the two signals.

These and other embodiments, aspects, advantages, and features of the present invention will be set forth in part in the description which follows, and in part will become apparent to those skilled in the art by reference to the following description of the invention and referenced drawings or by practice of the invention.

The aspects, advantages, and features of the invention are realized and attained by means of the instrumentalities, procedures, and combinations particularly pointed out in the appended claims.

DETAILED DESCRIPTION

Figure 1B:
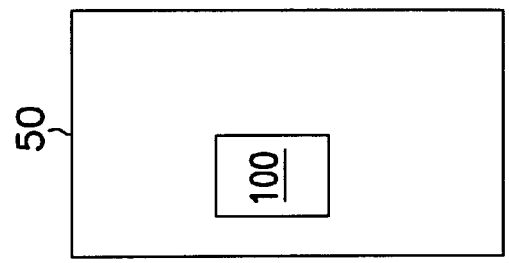
FIG. 1B is a block diagram illustrating the incorporation of the RF circuit of FIG. 1A into a signal processing integrated circuit 50 according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defmed above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to i.semiconductor material that is heavily doped p-type semiconductor material. The designations "nt–" and "p–" refer to lightly doped n- and p-type semiconductor materials, respectively.

Figure 1A:
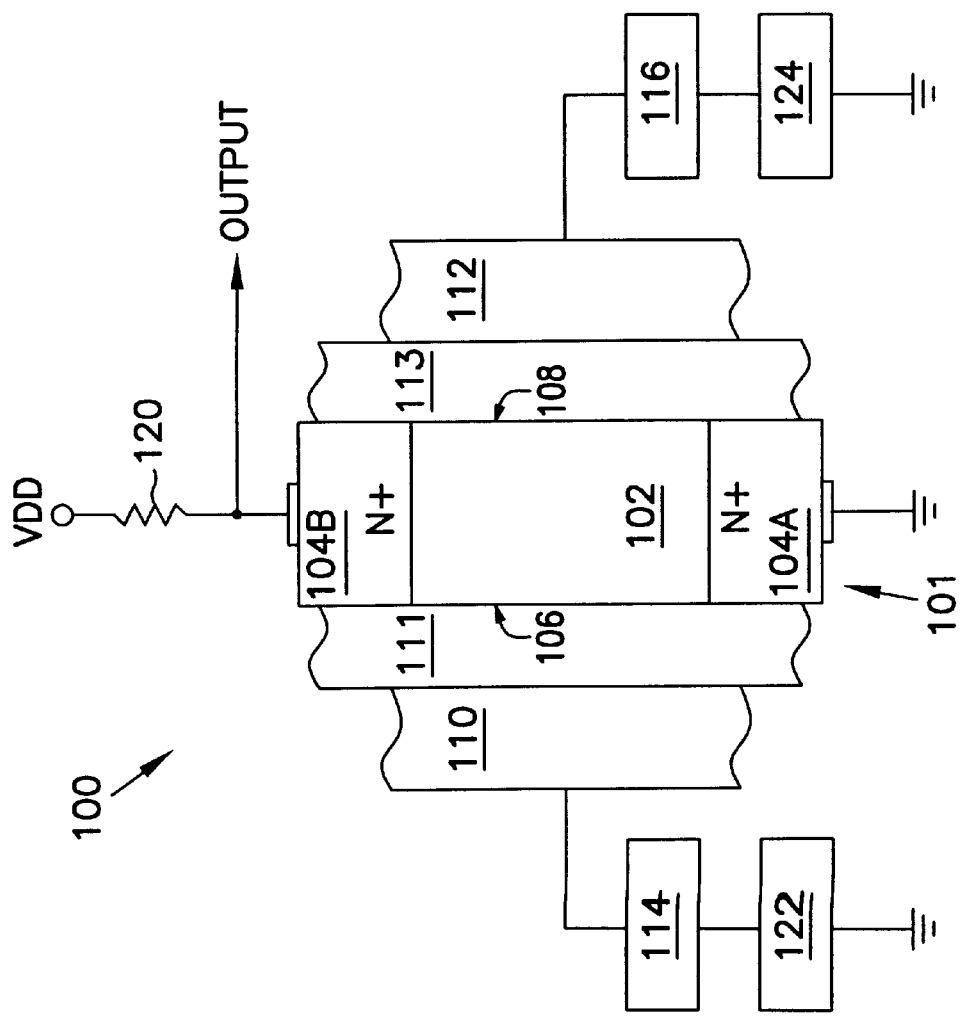
FIG. 1A is a diagram of an analog or RF circuit according to the teachings of the present invention.

FIG. 1A is a diagram of an analog or RF circuit 100 according to the teachings of the present invention. FIG. 1B is a block diagram illustrating the incorporation of the RF circuit 100 into a signal processing integrated circuit 50 according to the teachings of the present invention. The RF circuit 100 and digital integrated circuits are implemented on a single integrated circuit using, for example but not by way of limitation, a single complementary metal oxide semiconductor (CMOS) fabrication technique to form a signal processing integrated circuit 50.

Those skilled in the art will readily recognize that other semiconductor fabrication techniques may be used to implement the present invention. Thus, signal processing integrated circuit 50 includes both analog and digital circuits on a single die or substrate.

The RF circuit 100 may include a mixer circuit, a frequency multiplier, a heterodyne receiver, or any equivalent analog circuit structure. The RF circuit 100 includes a dual-gated metal-oxide semiconducting field effect transistor (MOSFET) 101, or transistor 101. In one embodiment, the dual-gated MOSFET is a vertical MOSFET such as, for example, the vertical MOSFET shown and described in co-pending application Ser. No. 08/889,462, entitled "Memory Cell Having A Vertical Transistor with Buried Source/Drain And Dual Gates," filed on Jul. 8, 1997, which application is incorporated herein by reference. In an alternative embodiment, the dual-gated MOSFET is a lateral MOSFET such as, for example,the lateral MOSFET shown and described in co-pending application Ser. No. 09/050,281, entitled "Circuits and Methods for Dual-Gated Transistors," filed on Mar. 30, 1998, which application is incorporated herein by reference. The dual-gated MOSFET 101 extends outwardly from a substrate and includes a first and a second source/drain region, 104A and 104B respectively. The dual-gated MOSFET includes a body region 102 which has opposing sidewall surfaces, 106 and 108 respectively. The body region 102 is formed with appropriate doping concentrations and with an appropriately narrow width between the opposing sidewall surfaces, 106 and 108, such that body region can be fully depleted during MOSFET operation. A first gate 110 is located on, and opposes, a first one 106 of the opposing sidewall surfaces, 106 and 108 respectively. A second gate 112 is located on, and opposes, a second one 108 of the opposing sidewall surfaces, 106 and 108 respectively. The threshold voltage ($V_t$) of the first gate 110 is dependent on the potential applied to the second gate 112.

The first gate 110 is separated from the first one 106 of the opposing sidewall surfaces, 106 and 108, of the body region 102 by a thin oxide layer 111. The second gate 112 is separated from the second one 108 of the opposing sidewall surfaces, 106 and 108, of the body region 102 by another thin oxide layer 113. A local oscillator 114 is coupled to the first gate 110 and provides a local oscillator signal to the first gate 110. A signal input 116 is coupled to the second gate 112 and provides an input signal to the second gate 112. In one embodiment, the signal input 116 provides input signals having frequencies in the gigahertz (GHz) range to the second gate 112. In an alternate embodiment, the signal input 116 provides input signals having frequencies in the megahertz (MHZ) range to the second gate 112.

Additionally, as illustrated in FIG. 1A, a first dc source 122 is coupled to the first gate 110. Similarly, a second dc source 124 is coupled to the second gate 112. In one embodiment, the first dc source 122 and the second dc source 124 are distinct dc sources. In an alternative embodiment, the first dc source 122 and the second dc source 124 are a single source. In one embodiment, illustrated by FIG. 1B, the RF or analog circuit 100 is an integral component of, and coupled to, an integrated circuit chip 50 and that integrated circuit chip 50 is adapted to processing digital and analog signals. In a further embodiment, the integrated circuit chip 50 includes a complementary metal-oxide semiconductor (CMOS) chip upon which the RF or analog circuit 100 is fabricated.

Figure 2:
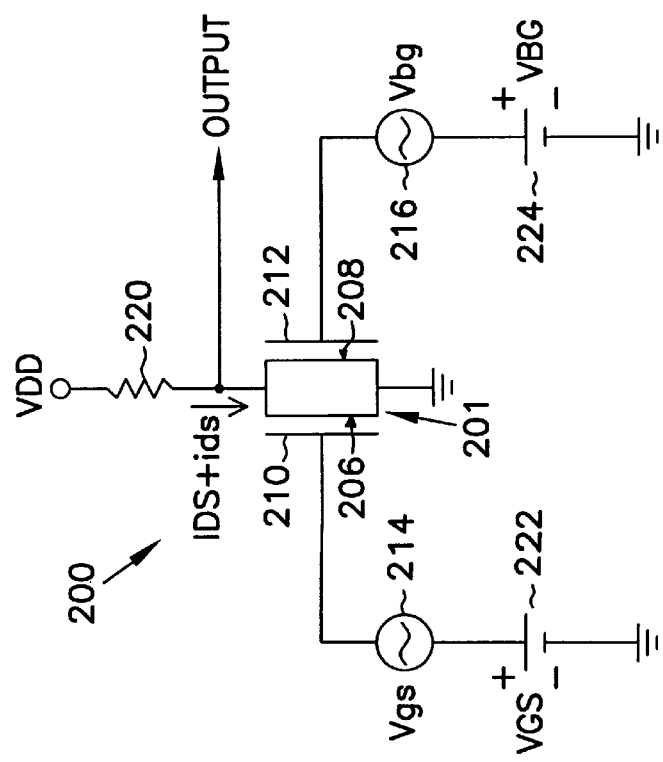
FIG. 2 is a schematic diagram illustrating an embodiment of the signal processing circuit of FIG. 1A.

FIG. 2 is a schematic diagram illustrating an embodiment 200 of the RF circuit 100 of FIG. 1A. The method of operation of the structural embodiment of FIG. 1A is described in connection with the schematic diagram of FIG. 2.

FIG. 2 illustrates that the operation of the RF circuit 200 employs the use of a dual-gated MOSFET 201. The dual-gated MOSFET 201 includes the structure of the dual-gated MOSFET presented and described in connection with FIG. 1A.

The dual-gated MOSFET 201 has a first gate 210 opposing a first one 206 of the dual-gated MOSFET's 201 opposing sidewall surfaces, 206 and 208 respectively.

The dual-gated MOSFET 201 further includes a second gate 212 opposing a second one 208 of the dual-gated MOSFET's 201 opposing sidewall surfaces, 206 and 208.

The method of operation includes biasing the first gate 210 of the dual-gated MOSFET 201. In one embodiment, the first gate 210 is biased by a first dc voltage source 222. In an alternative embodiment, any other suitable biasing means may be employed. Further, the second gate 212 is similarly biased using a second dc voltage source 224. In one embodiment, biasing the second gate 212 includes biasing the second gate 212 prior to biasing the first gate 210. In an alternative embodiment, the first gate 210 and the second gate 212 are biased using a single biasing means. The threshold voltage ($V_t$) of the first, or front, gate 210 to source voltage, VGS, of this device is a function of the second, or back, gate 212 to source voltage, VBG. Alternatively stated, biasing the second gate 212 has the effect of shifting the threshold voltage ($V_t$) of the first gate 210. When the dual-gated MOSFET 201 is turned on, e.g., VGS greater than $V_t$, the dual-gated MOSFET 201 is biased sufficiently to position the operation of the dual-gated MOSFET 201 in the non-linear region of the transistor. The drain current of the dual-gated MOSFET, IDS, is a function of the capacitance of the gate oxides and the potentials VGS and VBG, at the front and back gates, 210 and 212 respectively. A local oscillator signal, Vgs, having a first frequency is applied by a local oscillator 214 to the first, or front, gate 210. An input signal, Vbg, having a second frequency is applied by a signal input 216 to the second, or back, gate 212. Superimposing, or applying, the local oscillator signal, Vgs, and the input signal, Vbg, upon the dc biases already applied to the first and second gates, 210 and 212 respectively, creates a small signal drain current, ids. The ids signal will include frequency terms, w1 and w2, representing the product of the two signals, Vgs and Vbg. This action achieves the multiplier or mixer action. Using a trigonometric identity the product term can be shown to be composed of signals at the difference of the frequencies, w2−w1, and the sum of the frequencies, w2+w1. Terms involving the square of the signals, $Vgs^2$ and $Vbg^2$ can be shown using another trigonometric identity to represent frequency doubling. Hence, the operation of the RF or analog circuit 200 can be used in a wide variety of signal processing functions.

In effect, the method of driving the first and second gates, 210 and 212, in the fashion set forth above results in the dual-gated MOSFET 201 outputting an intermediate frequency at the drain region, or the second source/drain region as described in connection with the structure of FIG. 1A. This intermediate frequency signal is then a combination of the collective signals provided to the first and second gates, 210 and 212 of the dual-gated MOSFET. Moreover, a number of different intermediate frequencies will be outputted from the dual-gated MOSFET 201 dependent upon the variation of the collective signals provided to the first and second gates, 210 and 212. The number of intermediate frequency signals output at the drain includes the product of the local oscillator signal and the input signal, the difference of the local oscillator signal and the input signal, and the sum of the local oscillator signal and the input signal. The method of configuring relevant circuitry to isolate these stated intermediate frequencies will be understood by one of ordinary skill in the art of signal processing upon reading of this specification.

Further, under an embodiment of operation in the present invention, applying an input signal to a second gate 212 includes applying an input signal having a frequency in the gigahertz (GHz) range. According to an alternative embodiment, applying an input signal to a second gate 212 includes applying an input signal having a frequency in the megahertz (MHZ) range.

Figure 3:
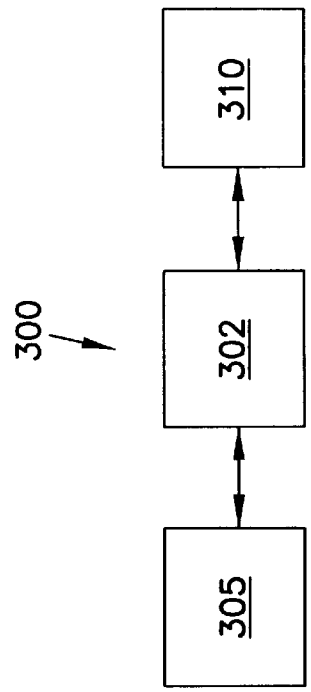
FIG. 3 is a block diagram illustrating a communication device according to an embodiment of the present invention.

FIG. 3 is a block diagram illustrating a communication device 300 according to an embodiment of the present invention. The communication device 300 includes the signal processing circuit 302 presented and described above in connection with FIGS. 1 and 2 as including signal processing integrated circuit 50 having an RF or analog portion 100 or 200. Further, the signal processing circuit 302 is electrically coupled to either a transmitter 305 or a receiver 310 or both and adapted to receiving and/or transmitting signals. The structure and method by which the transmitter 305 and the receiver 310 can be electrically coupled to the signal processing circuit 302 will be understood by one of ordinary skill in the art of signal processing upon reading of this specification. Accordingly, the detailed aspects of the transmitter 305 and the receiver 310 are not presented here.

Conclusion

An improved structure and method are provided for a signal processing circuit. The signal processing circuit is fabricated using current CMOS processing techniques. The structure includes dual-gated MOSFET, which means a fully depleted dual-gated MOSFET that has two gates one on each side of a thin, fully depleted silicon structure. The silicon film between the two gates is very thin so the device can be fully depleted. The dual-gated MOSFET is not simply two distinctly different FETs operating in parallel, but rather the threshold voltage of one gate of the dual-gated MOSFET depends on the bias of the other gate. Thus, the dua-gated MOSFET operates as one singular device structure where the current depends on the potential of both the front gate and the back gate. This yields a small signal component in analog circuit applications which depends on the product of the signals applied to the gates, and not one which depends on the sum of the two signals.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used.

The scope of the invention should be determined with reference to the appended claims, along with the full scope of equivalents to which such claims are entitled.

What is claimed is:

1. A mixer circuit, comprising:
 a transistor extending outwardly from a semiconductor substrate, the transistor having a source region, a body region, and a drain region, the body region having opposing sidewall surfaces, and wherein the body region includes a fully depleted structure;
 a first gate located on a first one of the opposing sidewall surfaces;
 a second gate located on a second one of the opposing sidewall surfaces;
 a local oscillator coupled to the first gate; and
 a signal input coupled to the second gate.

2. The mixer circuit of claim 1, wherein the signal input provides input signals having frequencies in the gigahertz (GHz) range to the second gate.

3. The mixer circuit of claim 1, wherein the signal input provides input signals having frequencies in the megahertz (MHZ) range to the second gate.

4. The mixer circuit of claim 1, wherein the transistor includes a lateral metal oxide semiconducting field effect transistor (MOSFET).

5. The mixer circuit of claim 1, wherein the transistor includes a vertical metal oxide semiconducting field effect transistor (MOSFET).

6. The mixer circuit of claim 1, wherein the first gate is coupled to a first dc source.

7. The mixer circuit of claim 1, wherein the second gate is coupled to a second dc source.

8. The mixer circuit of claim 1, wherein the first and the second gate are coupled to a single dc source.

9. The mixer circuit of claim 1, wherein the mixer circuit is coupled to an integrated circuit chip, wherein the integrated circuit chip is adapted to processing digital and analog signals.

10. The mixer circuit of claim 1, wherein the transistor is fabricated on a complementary metal-oxide semiconductor (CMOS) chip.

11. The mixer circuit of claim 1, wherein the threshold voltage ($V_t$) of the first gate is dependent on the potential applied to the second gate.

12. An analog circuit, comprising:
 a dual-gated metal-oxide semiconducting field effect transistor (MOSFET) extending outwardly from a semiconductor substrate, the dual-gated MOSFET including:
  a source region and a drain region;
  a body region, the body region having opposing sidewall surfaces, and wherein the body region includes a fully depleted structure;
  a first gate located on a first one of the opposing sidewall surfaces;
  a second gate located on a second one of the opposing sidewall surfaces;
 a local oscillator coupled to the first gate, wherein the local oscillator provides a local oscillator signal to the first gate; and
 a signal input coupled to the second gate, wherein the signal input provides an input signal to the second gate.

13. The analog circuit of claim 12, wherein the first gate is coupled to a first dc source.

14. The analog circuit of claim 12, wherein the second gate is coupled to a second dc source.

15. The analog circuit of claim 12, wherein the first and the second gate are coupled to a single dc source.

16. The analog circuit of claim 11, wherein the threshold voltage ($V_t$) of the first gate is dependent on the potential applied to the second gate.

17. The analog circuit of claim 11, wherein the non-linear characteristics of the dual-gated MOSFET are adapted to producing an intermediate frequency signal from the local oscillator signal and the input signal.

18. The analog circuit of claim 17, wherein the intermediate frequency signal represents the product of the local oscillator signal and the input signal.

19. The analog circuit of claim 17, wherein the intermediate frequency signal represents the difference of the local oscillator signal and the input signal.

20. The analog circuit of claim 17, wherein the intermediate frequency signal represents the sum of the local oscillator signal and the input signal.

21. The analog circuit of claim 12, wherein the analog circuit is a heterodyne receiver.

22. The analog circuit of claim 12, wherein the analog circuit is a frequency multiplier.

23. A communication device, comprising:
a signal processing circuit, wherein the signal processing circuit includes:
a dual-gated metal-oxide semiconducting field effect transistor (MOSFET) extending outwardly from a semiconductor substrate, the transistor including:
a source region and a drain region;
a body region, the body region having opposing sidewall surfaces, and wherein the body region includes a fully depleted structure;
a first gate located on a first one of the opposing sidewall surfaces; and
a second gate located on a second one of the opposing sidewall surfaces;
a local oscillator coupled to the first gate, wherein the local oscillator provides a local oscillator signal; and
a signal input coupled to the second gate, wherein the signal input provides an input signal; and
a receiver.

24. The communication device of claim 23, wherein the signal input is adapted to receiving input signals in the gigahertz (GHz) frequency range.

25. The communication device of claim 23, wherein the signal input is adapted to receiving input signals in the megahertz (MHZ) frequency range.

26. The communication device of claim 23, wherein the first gate is coupled to a first dc source.

27. The communication device of claim 23, wherein the second gate is coupled to a second dc source.

28. The communication device of claim 23, wherein the dual-gated MOSFET is fabricated on a complementary metal-oxide semiconductor (CMOS) chip.

29. The communication device of claim 23, wherein the non-linear characteristics of the dual-gated MOSFET are adapted to producing an intermediate frequency signal at the drain region from the local oscillator signal and the input signal.

30. The communication device of claim 29, wherein the intermediate frequency signal represents the product of the local oscillator signal and the input signal.

31. The communication device of claim 29, wherein the intermediate frequency signal represents the difference of the local oscillator signal and the input signal.

32. The communication device of claim 29, wherein the intermediate frequency signal represents the sum of the local oscillator signal and the input signal.

33. A method of signal processing, comprising:
biasing a first gate of a dual-gated MOSFET, wherein the dual-gated MOSFET includes:
a source region and a drain region; and
a body region, the body region having opposing sidewall surfaces,
wherein the body region includes a fully depleted structure,
and wherein the first gate opposes a first one of the opposing sidewall surfaces;
biasing a second gate of the dual-gated MOSFET, wherein the second gate opposes a second one of the opposing sidewall surfaces;
applying a local oscillator signal to the first gate; and
applying an input signal to the second gate.

34. The method of claim 33, wherein biasing the second gate includes biasing the second gate prior to biasing the first gate.

35. The method of claim 33, wherein biasing the second gate includes shifting the threshold voltage ($V_t$) of the first gate.

36. The method of claim 33, wherein applying a local oscillator signal and an input signal to the first and second gates of the dual-gated MOSFET includes outputting a number of intermediate frequency signals at the drain region of the dual-gated MOSFET.

37. The method of claim 36, wherein outputting a number of intermediate frequency signals includes outputting the product of the local oscillator signal and the input signal.

38. The method of claim 36, wherein outputting a number of intermediate frequency signals includes outputting the difference of the local oscillator signal and the input signal.

39. The method of claim 36, wherein outputting a number of intermediate frequency signals includes outputting the sum of the local oscillator signal and the input signal.

40. The method of claim 33, wherein applying an input signal to a second gate includes an input signal having a frequency in the gigahertz (GHz) range.

41. The method of claim 33, wherein applying an input signal to a second gate includes an input signal having a frequency in the megahertz (MHZ) range.

42. A signal processing circuit, comprising:
a digital logic circuit; and
an analog circuit, including:
a dual-gated metal-oxide semiconducting field effect transistor (MOSFET) extending outwardly from a semiconductor substrate, the dual-gated MOSFET including:
a source region and a drain region;
a body region, the body region having opposing sidewall surfaces, and wherein the body region includes a fully depleted structure;
a first gate located on a first one of the opposing sidewall surfaces;
a second gate located on a second one of the opposing sidewall surfaces;
a first input coupled to the first gate to receive an oscillator signal; and
a second input coupled to the second gate to receive an RF signal.

43. The signal processing circuit of claim 42, wherein the digital logic circuit and the analog circuit are implemented on a single integrated circuit.

44. The signal processing circuit of claim 43, wherein the digital logic circuit and the analog circuit are fabricated using CMOS processing techniques.

45. An analog circuit, comprising:
a dual-gated metal-oxide semiconducting field effect transistor extending outwardly from a substrate, including:
a source region and a drain region;
a body region, the body region having opposing sidewall surfaces, and wherein the body region includes an area which is capable of being fully depleted;
a first gate located on a first one of the opposing sidewall surfaces;
a second gate located on a second one of the opposing sidewall surfaces;
a first input coupled to the first gate to receive an oscillator signal; and
a second input coupled to the second gate to receive an RF signal.

46. The signal processing circuit of claim 45, wherein the digital logic circuit and the analog circuit are implemented on a single integrated circuit.

47. The signal processing circuit of claim 46, wherein the digital logic circuit and the analog circuit are fabricated using CMOS processing techniques.

48. A single integrated circuit, comprising:
- a digital logic circuit fabricated with a CMOS process; and
- an analog circuit fabricated with the CMOS process, including:
  - a dual-gated metal-oxide semiconducting field effect transistor extending outwardly from a semiconductor substrate, including:
    - a source region and a drain region;
    - a body region, the body region having opposing sidewall surfaces, and wherein the body region includes a fully depleted structure;
    - a first gate located on a first one of the opposing sidewall surfaces;
    - a second gate located on a second one of the opposing sidewall surfaces;
  - a first input coupled to the first gate to receive an oscillator signal; and
  - a second input coupled to the second gate to receive an RF signal.

* * * * *

UNITED STATES PATENT AND TRADEMARK OFFICE
CERTIFICATE OF CORRECTION

PATENT NO. : 6,104,068
DATED : Aug. 15, 2000
INVENTOR(S) : Forbes

It is certified that error appears in the above-identified patent and that said Letters Patent is hereby corrected as shown below:

On the face page, delete "*Attorney, Agent or Firm*--Schwegman, Lundberg, Woesner & Kluth, P.A." and insert --*Attorney, Agent or Firm*--Schwegman, Lundberg, Woessner & Kluth, P.A.--, therefor.
In column 3, lines 47-48, delete the paragraph break after "invention.".

In column 4, line 34, delete "defmed" and insert --defined--, therefor.

In column 4, line 44, delete "i.semiconductor" and insert --semiconductor--, therefor.

In column 4, line 45, delete "nt-" and insert --n- --, therefor.

In column 4, lines 57-58, delete the paragraph break after "circuit 50.".

In column 5, line 8, insert a space after "example,".

In column 5, lines 59-60, delete the paragraph break after "FIG. 2.".

In column 5, lines 64-65, delete the paragraph break after "FIG. 1A.".

In column 5, line 67 and column 6, line 1, delete the paragraph break after "respectively.".

In column 7, line 32, delete "dua-gated" and insert --dual-gated--, therefor.

Signed and Sealed this

First Day of May, 2001

Attest:

NICHOLAS P. GODICI

Attesting Officer    Acting Director of the United States Patent and Trademark Office